United States Patent
Yu et al.

(10) Patent No.: US 8,946,742 B2
(45) Date of Patent: Feb. 3, 2015

(54) SEMICONDUCTOR PACKAGE WITH THROUGH SILICON VIAS

(75) Inventors: Chen-Hua Yu, Hsinchu (TW); Hung-Pin Chang, Taipei County (TW); Yung-Chi Lin, Su-Lin (TW); Chia-Lin Yu, Sigang Township (TW); Jui-Pin Hung, Hsinchu (TW); Chien Ling Hwang, Hsinchu (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 75 days.

(21) Appl. No.: 12/897,124

(22) Filed: Oct. 4, 2010

(65) Prior Publication Data

US 2011/0241040 A1      Oct. 6, 2011

Related U.S. Application Data

(60) Provisional application No. 61/320,819, filed on Apr. 5, 2010.

(51) Int. Cl.
  *H01L 33/00* (2010.01)
  *H01L 21/768* (2006.01)
  (Continued)

(52) U.S. Cl.
  CPC ...... *H01L 21/76877* (2013.01); *H01L 21/6835* (2013.01); *H01L 23/481* (2013.01);
  (Continued)

(58) Field of Classification Search
  CPC ......... H01L 33/48; H01L 33/52; H01L 33/42; H01L 21/486; H01L 21/76877; H01L 33/486; H01L 23/481; H01L 33/641; H01L 33/382; H01L 21/481; H01L 21/6835
  USPC .............. 438/629, 637, 653, 667, 29; 257/91, 257/751, E23.161, E33.065, E21.584, 257/E21.585, 698, 774, E23.011, E21.597, 257/95, 98, 99, 100
  See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |

(Continued)

FOREIGN PATENT DOCUMENTS

| | | |
|---|---|---|
| CN | 1639383 (A) | 7/2005 |
| CN | 101577304 | 11/2009 |

(Continued)

OTHER PUBLICATIONS

Kamakura Masanao "Light-Emitting Apparatus", JP Pub. 2008-034748 (Feb. 14, 2008), Machine English Translation.*

(Continued)

*Primary Examiner* — Khiem D Nguyen
(74) *Attorney, Agent, or Firm* — Haynes and Boone, LLP

(57) ABSTRACT

The substrate with through silicon plugs (or vias) described above removes the need for conductive bumps. The process flow is very simple and cost efficient. The structures described combines the separate TSV, redistribution layer, and conductive bump structures into a single structure. By combining the separate structures, a low resistance electrical connection with high heat dissipation capability is created. In addition, the substrate with through silicon plugs (or vias, or trenches) also allows multiple chips to be packaged together. A through silicon trench can surround the one or more chips to provide protection against copper diffusing to neighboring devices during manufacturing. In addition, multiple chips with similar or different functions can be integrated on the TSV substrate. Through silicon plugs with different patterns can be used under a semiconductor chip(s) to improve heat dissipation and to resolve manufacturing concerns.

20 Claims, 30 Drawing Sheets

(51) Int. Cl.
  *H01L 21/683*  (2006.01)
  *H01L 23/48*  (2006.01)
  *H01L 33/48*  (2010.01)
  *H01L 33/64*  (2010.01)
  *H01L 21/48*  (2006.01)
  *H01L 23/14*  (2006.01)
  *H01L 23/498*  (2006.01)
  *H01L 23/00*  (2006.01)
  *H01L 33/62*  (2010.01)

(52) U.S. Cl.
  CPC ............ *H01L33/486* (2013.01); *H01L 33/641* (2013.01); *H01L 21/486* (2013.01); *H01L 23/147* (2013.01); *H01L 23/49827* (2013.01); *H01L 24/29* (2013.01); *H01L 24/49* (2013.01); *H01L 24/97* (2013.01); *H01L 33/62* (2013.01); *H01L 2221/68345* (2013.01); *H01L 2221/68359* (2013.01); *H01L 2224/32225* (2013.01); *H01L 2224/32506* (2013.01); *H01L 2224/48091* (2013.01); *H01L 2224/48227* (2013.01); *H01L 2224/48233* (2013.01); *H01L 2224/49113* (2013.01); *H01L 2224/73265* (2013.01); *H01L 2924/01029* (2013.01); *H01L 2924/01078* (2013.01); *H01L 2924/01079* (2013.01); *H01L 2924/04941* (2013.01); *H01L 2924/19041* (2013.01); *H01L 24/48* (2013.01); *H01L 2924/01019* (2013.01); *H01L 2924/01322* (2013.01); *H01L 2924/12041* (2013.01); *H01L 2224/97* (2013.01)
  USPC ............................... 257/98; 257/99; 438/667

(56) References Cited

U.S. PATENT DOCUMENTS

| | | | |
|---|---|---|---|
| 5,550,391 | A | 8/1996 | Yamaguchi |
| 5,767,001 | A | 6/1998 | Bertagnolli et al. |
| 5,998,292 | A | 12/1999 | Black et al. |
| 6,184,060 | B1 | 2/2001 | Siniaguine |
| 6,322,903 | B1 | 11/2001 | Siniaguine et al. |
| 6,448,168 | B1 | 9/2002 | Rao et al. |
| 6,465,892 | B1 | 10/2002 | Suga |
| 6,472,293 | B1 | 10/2002 | Suga |
| 6,531,328 | B1 * | 3/2003 | Chen ................................ 438/26 |
| 6,538,333 | B2 | 3/2003 | Kong |
| 6,599,778 | B2 | 7/2003 | Pogge et al. |
| 6,639,303 | B2 | 10/2003 | Siniaguine |
| 6,664,129 | B2 | 12/2003 | Siniaguine |
| 6,693,361 | B1 | 2/2004 | Siniaguine et al. |
| 6,740,582 | B2 | 5/2004 | Siniaguine |
| 6,800,930 | B2 | 10/2004 | Jackson et al. |
| 6,841,883 | B1 | 1/2005 | Farnworth et al. |
| 6,882,030 | B2 | 4/2005 | Siniaguine |
| 6,924,551 | B2 | 8/2005 | Rumer et al. |
| 6,962,867 | B2 | 11/2005 | Jackson et al. |
| 6,962,872 | B2 | 11/2005 | Chudzik et al. |
| 7,030,481 | B2 | 4/2006 | Chudzik et al. |
| 7,049,170 | B2 | 5/2006 | Savastiouk et al. |
| 7,060,601 | B2 | 6/2006 | Savastiouk et al. |
| 7,071,546 | B2 | 7/2006 | Fey et al. |
| 7,111,149 | B2 | 9/2006 | Eilert |
| 7,122,912 | B2 | 10/2006 | Matsui |
| 7,157,787 | B2 | 1/2007 | Kim et al. |
| 7,169,703 | B2 | 1/2007 | Aomori |
| 7,193,308 | B2 | 3/2007 | Matsui |
| 7,262,495 | B2 | 8/2007 | Chen et al. |
| 7,297,574 | B2 | 11/2007 | Thomas et al. |
| 7,335,972 | B2 | 2/2008 | Chanchani |
| 7,355,273 | B2 | 4/2008 | Jackson et al. |
| 7,582,496 | B2 | 9/2009 | Lee et al. |
| 2005/0093428 | A1 | 5/2005 | Kaneko et al. |
| 2005/0133930 | A1 * | 6/2005 | Savastiouk et al. ........... 257/774 |
| 2005/0142874 | A1 * | 6/2005 | Keum ........................... 438/687 |
| 2005/0280022 | A1 | 12/2005 | Ueda et al. |
| 2006/0170072 | A1 * | 8/2006 | Nakashiba ..................... 257/531 |
| 2006/0261364 | A1 * | 11/2006 | Suehiro et al. ................ 257/100 |
| 2007/0108452 | A1 | 5/2007 | Kauer |
| 2007/0114545 | A1 | 5/2007 | Jang et al. |
| 2007/0194343 | A1 * | 8/2007 | Jang et al. ..................... 257/103 |
| 2008/0111139 | A1 | 5/2008 | Chae et al. |
| 2009/0256217 | A1 * | 10/2009 | Lu et al. ........................ 257/415 |
| 2009/0273002 | A1 * | 11/2009 | Chiou et al. .................... 257/99 |
| 2010/0022040 | A1 * | 1/2010 | Konishi et al. ................. 438/29 |
| 2010/0038674 | A1 | 2/2010 | Chen |
| 2013/0221320 | A1 | 8/2013 | Li et al. |

FOREIGN PATENT DOCUMENTS

| | | | |
|---|---|---|---|
| JP | 11186607 | | 7/1999 |
| JP | 2008-34748 | * | 2/2008 .............. H01L 33/00 |

OTHER PUBLICATIONS

US Patent Office, Office Action dated Mar. 16, 2012, U.S. Appl. No. 12/539,757, 16 pages.

Chinese Patent Office, Office Action dated Sep. 1, 2010, Application No. 200910166790.x, 6 pages.

Chang, S.J., et al., "Nitride-Based LEDs with an Insulating $SiO_2$ Layer Underneath p-Pad Electrodes," Electrochemical and Solid-State Letters, vol. 10, No. 6, 2007, pp. H175-H177, (2007).

Chowdhury, S., et al., "Enhancement and Depletion Mode AlGaN/GaN CAVET with Mg-Ion-Implanted GaN as Current Blocking Layer," IEEE Electron Device Letters, vol. 29, No. 6, Jun. 2008, pp. 543-545.

Huh, C., et al., "Improvement in light-output efficiency of InGaN/GaN multiple-quantum well light-emitting diodes by current blocking layer," Journal of Applied Physics, vol. 92, No. 5, Sep. 1, 2002, pp. 2248-2250.

US Patent Office, unpublished U.S. Appl. No. 13/405,906, filed Feb. 7, 2012, 32 pages.

Non-Final Office Action mailed Jul. 3, 2013 in U.S. Appl. No. 13/418,663 (11 pages).

Chinese Patent Office, Office Action dated Feb. 20, 2014, Application No. 201110070897.1, 8 pages.

* cited by examiner

SEMICONDUCTOR PACKAGE WITH THROUGH SILICON VIAS

CLAIM OF PRIORITY

The present application claims the priority of U.S. Provisional application No. 61/320,819, entitled "Novel Semiconductor Package With Through Silicon Vias," filed on Apr. 5, 2010, which is incorporated herein by reference in its entirety.

CROSS REFERENCES TO RELATED APPLICATIONS

The present application is related to U.S. application Ser. No. 12/329,138, entitled "METHOD FOR PRODUCING STACKABLE DIES," filed on Dec. 5, 2008, and U.S. application Ser. No. 12/879,584, entitled HEAT DISSIPATION BY THROUGH SILICON PLUGS, filed on Sep. 10, 2010, which are incorporated herein by reference in their entireties.

FIELD

This application relates to packaging of semiconductor chips and, more particularly, to packaging of semiconductor chips using through silicon vias.

BACKGROUND

The trend in advanced semiconductor packaging has been to reduce the form factor while improving electrical performance. This enables products for industry and consumers that are faster, cheaper and smaller. Through silicon vias (TSVs), or more accurately, through silicon plugs (TSPs) provide an approach to achieve higher levels of integration and form factor reduction for advanced semiconductor packaging. As the name implies, the electrical connection of the back and front of a semiconductor device enables the possibility of vertically assembling multiple chips in a package where previously only one chip was present. Accordingly, more semiconductor devices can be integrated into a smaller form factor. In addition, different types of semiconductor chips can be also integrated in a single package to create a so-called system in a package (SIP). Irrespective of the approach, the footprint of multiple packages in the printed circuit board is reduced which also reduces final product cost. Finally, interconnecting the chips by using TSVs can decrease the number of electrical connections necessary to the substrate [unit] since one substrate connection can service multiple chips. This also helps to simplify the assembly process and improve yield.

In addition, through silicon vias provide superior heat dissipation mechanism. Packaging utilizing through silicon vias is a new technology. The structures and methods of manufacturing for through silicon vias are still being perfected by various interested groups. It is within this context the following disclosure arises.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENTS

Figure 1A:
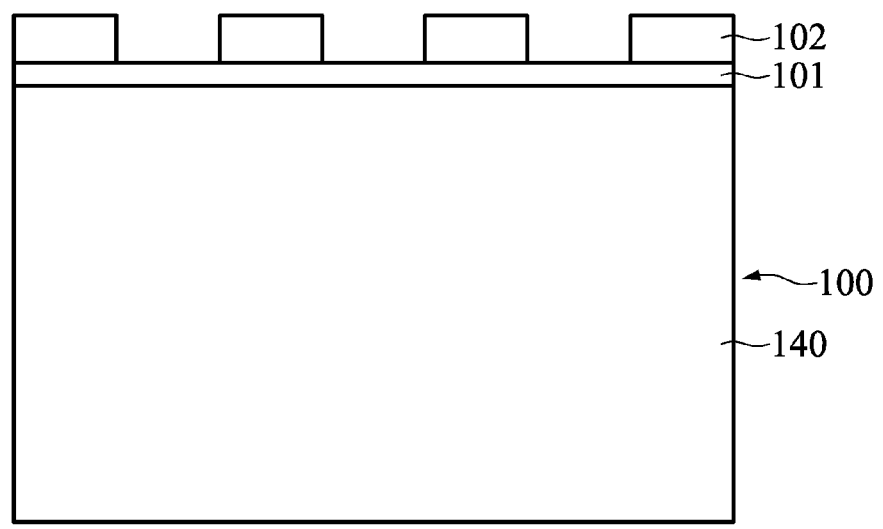
FIGS. 1A-18 illustrate structures and intermediate stages in a process flow for creating a package for a semiconductor die, in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIGS. 1A-18 show cross-sectional views of intermediate stages in the making of some embodiments of this disclosure. FIG. 1A shows a first substrate 100 with a photoresist pattern, in accordance with some embodiments of this disclosure. The first substrate 100 may comprise, for example, bulk silicon, doped or undoped, or an active layer of a semiconductor-on-insulator (SOI) substrate. Generally an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substances, such as multi-layered or gradient substrates may also be used.

In the example described here, the first substrate 100 is made of a silicon material 140. There is a dielectric layer 101 deposited over the silicon material 140. A photoresist layer 102 is then deposited over the dielectric layer 101 and the photoresist layer 102 is patterned with openings, such as openings of through silicon vias. The dielectric layer 101 is a sacrificial layer used to protect substrate surface during the etching process of through silicon vias.

Figure 1B:
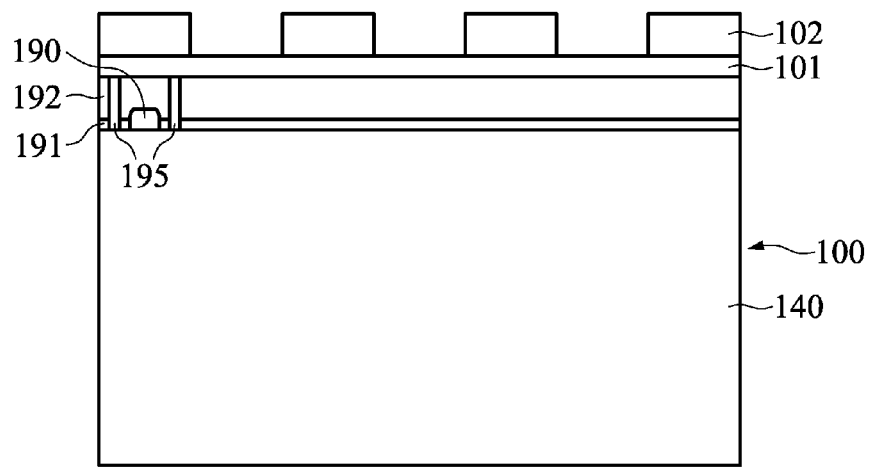

In some embodiment, the first substrate 100 already has an electrical circuitry 190 built in, as shown in FIG. 1B, before the photoresist layer 102 is deposited and patterned. FIG. 1B shows an electrical circuitry 190 has been formed on the first substrate 100. The electrical circuitry 190 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, the electrical circuitry 113 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 1B are an etch stop layer 191 and an inter-layer dielectric (ILD) layer 192. In some embodiments, the etch stop layer 191 is preferably formed of a dielectric material having a different etch selectivity from adjacent layers, e.g., the underlying first substrate 110 and the overlying ILD layer 192. In an embodiment, the etch stop layer 191 may be formed of SiN, SiCN, SiCO, CN, combinations thereof, or the like deposited by chemical vapor deposition (CVD) or plasma-enhanced CVD (PECVD) techniques.

The ILD layer 192 may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof or the like, by any suitable method known in the art, such as spinning, CVD, and PECVD. It should also be noted that the etch stop layer 191 and the ILD layer 120 may each comprise a plurality of dielectric layers, with or without an etch stop layer formed between adjacent dielectric layers.

Contacts 195 are formed through the ILD layer 192 to provide an electrical contact to the electrical circuitry 190. The contacts 195 may be formed, for example, by using photolithography techniques to deposit and pattern a photoresist material on the ILD layer 192 to expose portions of the ILD layer 192 that are to become the contacts 118. An etch process, such as an anisotropic dry etch process, may be used to create openings in the ILD layer 192. The openings are, preferably, lined with a diffusion barrier layer and/or an adhesion layer (not shown), and filled with a conductive material. Preferably, the diffusion barrier layer comprises one or more layers of TaN, Ta, TiN, Ti, CoW, or the like, and the conductive material comprises copper, tungsten, aluminum, silver, and combinations thereof, or the like, thereby forming the contacts 195 as illustrated in FIG. 1B.

Figure 2:
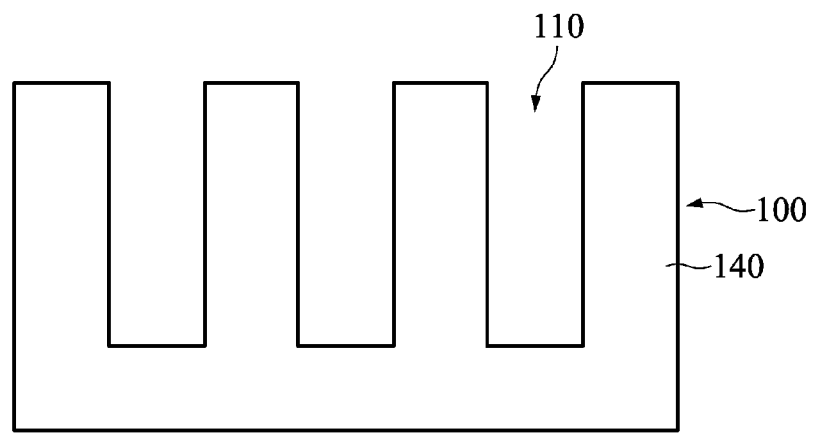

FIG. 2 shows first substrate 100 after the openings have been etched, in accordance with some embodiments. Although FIG. 2 does not show the electrical circuitry 190, contact plugs 195, and dielectric layers 191 and 192 of FIG. 1B, such features can exist in FIG. 2 and the figures following FIG. 2. In an embodiment, a timed etching process, such as an anisotropic dry etch process, is performed until a desired depth for the openings 110 is obtained in the first substrate 100. It should be understood that the etch processes described herein may be accomplished in single etch processes or multiple etch processes. The etching process(es) can be a dry process or a wet process.

In some embodiments, the depths of openings may range from about 20 µm to about 200 µm. In some embodiments, the widths of openings may range from about 5 µm to about 100 µm. In some embodiments, the openings 110 are through silicon vias (or trenches). Etching openings with such depths by purely relying on the photoresist layer 102 could be challenging. In the embodiments shown here, the dielectric layer 101 is first etched opened and be used as a patterning mask.

The material for the dielectric layer 101 can be any dielectric material, such as silicon dioxide, silicon nitride, or a combination of both films. One example of a material for the dielectric layer 101 is silicon oxide deposited by plasma enhanced chemical vapor deposition (PECVD) using TEOS (Tetraethyl orthosilicate) as the silicon source. PECVD silane oxide film can also be used. In some embodiments, the TEOS oxide has a thickness between about 500 Å to about 10000 Å. The dielectric layer 101 does not need to be deposited by PECVD. The dielectric layer 101 can be a spin-on dielectric (SOD) or a spin-on glass (SOG). The dielectric layer 101 can also be deposited (or grown) by a thermal process, such as a thermally grown silicon dioxide, or an oxide film deposited by thermal CVD.

Figure 3:
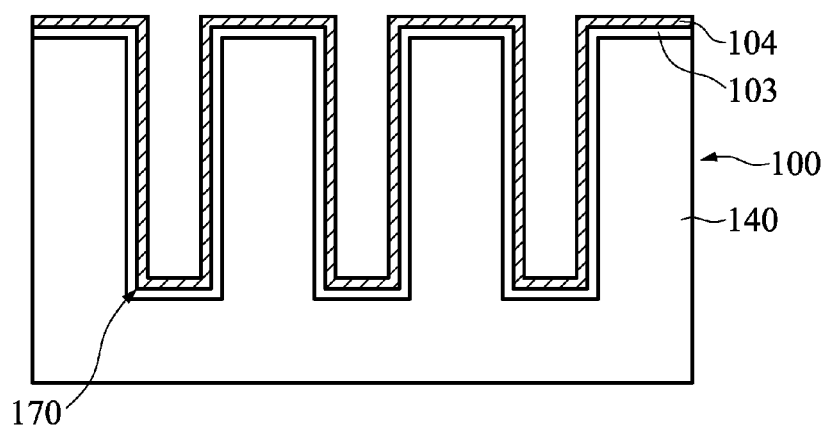

After the through silicon vias have been etched, the photoresist and the sacrificial dielectric layer 101 are both removed. After the openings, such as opening 110, are created, the openings are filled. FIG. 3 shows that the substrate is first lined with an isolation layer 103 and a barrier/Cu-seed layer 104, in accordance with some embodiments. The isolation layer 103 is made of a dielectric material, such as oxide, nitride, or a combination of both. One example of a material for the isolation layer 101 is silicon oxide deposited by plasma enhanced chemical vapor deposition (PECVD) using silane or TEOS as the silicon source. In some embodiments, the isolation layer has a thickness between about 500 Å to about 15000 Å. The isolation layer 103 can also be deposited (or grown) by a thermal process, such as a thermally grown oxide, or a thermal CVD oxide. Alternatively, the dielectric isolation layer 103 can be a doped film, using dopants such as phosphorus (P) or boron (B) and phosphorus (P). The phosphorus (P) in the PSG (phosphorus silicon glass) or BPSG (boron phosphorus silicon glass) film can getter copper, which is used to fill the openings, which are through silicon vias (or trenches) in this example. Copper can diffuse in the silicon substrate. Although the through silicon vias are lined with a barrier layer, which will be described later, the barrier coverage could be insufficient on the sidewalls near the bottom of the vias, such as corner 170. Using PSG or BPSG as the isolation layer 103 can provide extra protection against copper diffusion.

Dielectric layer has higher thermal resistance than silicon. Table I compares the simulation results for the 3 thermal resistance of silicon substrate with an oxide dielectric layer of varying thicknesses.

TABLE I

Comparison of thermal resistance for various silicon/oxide thicknesses.

| Si/Oxide (µm/µm) | Thermal Resistance (K/Watt) |
|---|---|
| 100/0 | 1.81 |
| 100/1.5 | 6.37 |
| 50/0 | 0.92 |
| 50/1.5 | 5.95 |

The data in Table I show that oxide could significantly increase the thermal resistance. Therefore, the thickness of dielectric layers in the package should be kept to minimum.

After the isolation layer 103 is deposited, a barrier/Cu-seed layer 104 is deposited. The barrier/Cu-seed layer 104 includes at least two sub-layers, a barrier layer and a copper seed layer. The barrier layer is made of one or more copper barrier materials, such as Ta, TaN, Ti, TiN, CoW, or the like. The barrier layer provides protection against copper diffusing into the silicon substrate 100. The barrier layer can be deposited by PVD (physical vapor deposition), chemical vapor deposition (CVD), atomic layer deposition (ALD), or other suitable methods. After the deposition of the barrier layer, a copper seed layer is deposited. The similarly, the copper seed layer can be deposited by PVD (physical vapor deposition), chemical vapor deposition (CVD), atomic layer deposition (ALD), or other suitable methods. In some embodiments, the barrier/Cu-seed layer 104 is made of TaN/Ta barrier and a copper seed layer. The barrier layer 104 in this embodiment is made of two sub layers, a TaN layer and a Ta layer. In some embodiments, TaN, Ta and Cu seed are all deposited by PVD, and the deposition of TaN, Ta, and Cu seed are all conducted in one single PVD chamber with different targets and sputtering gases. In some embodiments, each thickness of TaN and Ta is between about 100 Å to about 2000 Å, and the thickness of the copper seed is between about 1000 Å to about 15000 Å.

Figure 4:
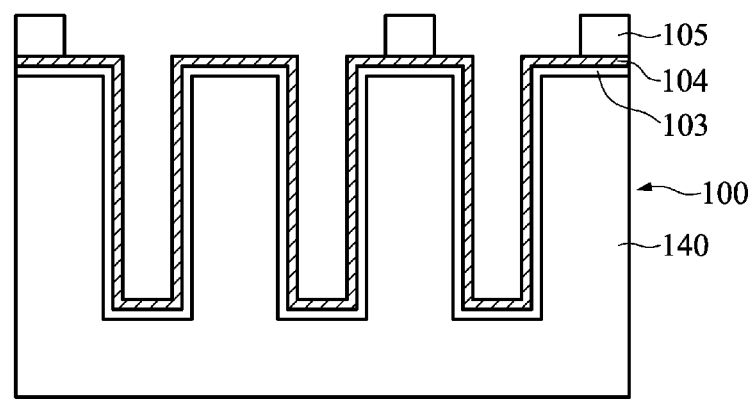

After the deposition of the barrier/copper-seed layer 104, the substrate is patterned to define areas to receive copper plating. FIG. 4 shows a patterned photoresist layer 105 being formed on the first substrate 100, in accordance with some embodiments. In some embodiments, the patterned photo-layer 105 is made of conventional photoresist, which is in liquid form and is deposited by a spin-on process. In another embodiment, the material of the patterned photo-layer 105 is a dry film resist (DFR), which can also be patterned by photolithography (i.e. with light exposure). The DFR can be a positive or a negative photoresist. DFR has been used for creating patterns for copper plating for circuit boards. An example of DFR is MP112, made by TOK CO. LTD. of Japan. After the DFR is laminated on the first substrate 100 (or over layer 104), the DFR is exposed with a pattern that defines areas on the substrate surface that would receive copper plating. Using dry film resist has an advantage over the wet spin-on photoresist that the dry film resist is only laminated on the substrate surface. In contrast, wet spin-on photoresist would flow into the openings, such as opening 110. Since the openings for through silicon vias (or trenches) are quite deep, as mentioned above between about 20 µm to about 200 µm, the wet photoresist filled inside could be hard to removed completely for copper to be properly plated on the sidewalls and bottom surfaces of the openings.

Figure 5:
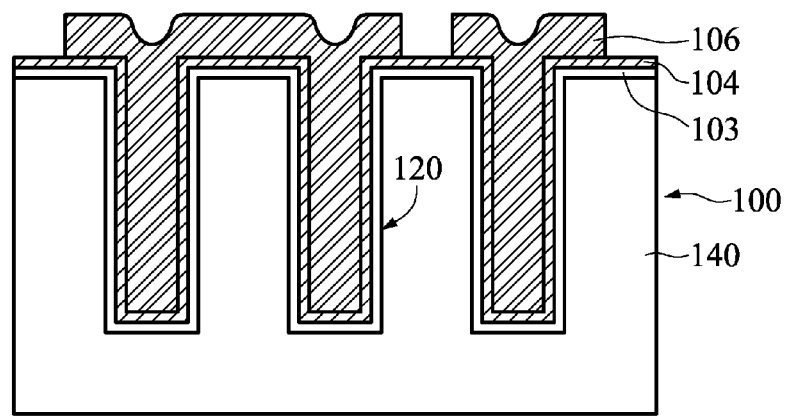

FIG. 5 shows a copper film 106 being plated on the first substrate 100 and the DRF being stripped from the substrate surface after copper plating, in accordance with some embodiments. Electrical copper plating (ECP) processes or electroless copper plating process used in the metal interconnects of semiconductor device manufacturing can be used. In some embodiments, the thickness of the copper film 106 is less than about 40 µm. In other embodiments, the thickness of the copper film 106 is less than about 30 µm. In yet some other embodiments, the thickness of the copper film 106 is less than about 25 µm. A copper film that is too thick could result in substrate warping. In some embodiments, the copper film 106 is deposited to only fill the openings (or through silicon vias), such as opening 110 shown in FIG. 4. In another embodiment, the copper film 106 is deposited not only to fill the (through silicon via) openings, but also to provide landing pads for packaged devices on a substrate, such as a PCB (printed circuit board), or to receive semiconductor chips.

In some embodiments, the thickness of film 106 is between about 10 µm to about 30 µm. After copper film 106 is plated, the photo-layer 105 is removed. Both wet spin-on photoresist and dry film resist can be removed by ashing process, which is typically followed by a wet clean to completely remove the impurities on the substrate surface.

Figure 6:
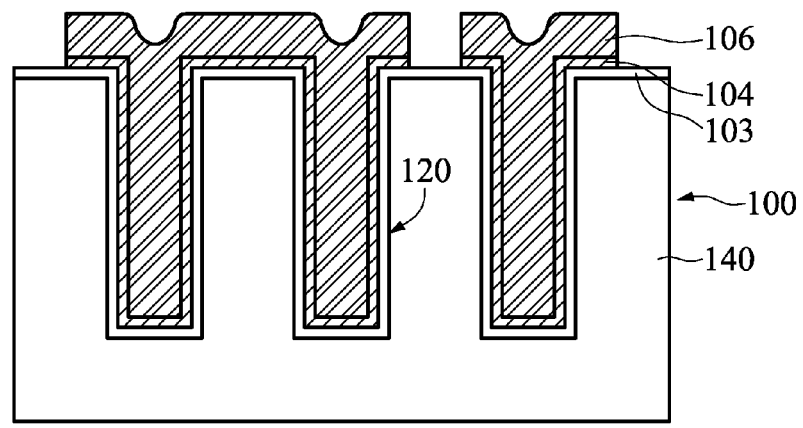
Figure 7:
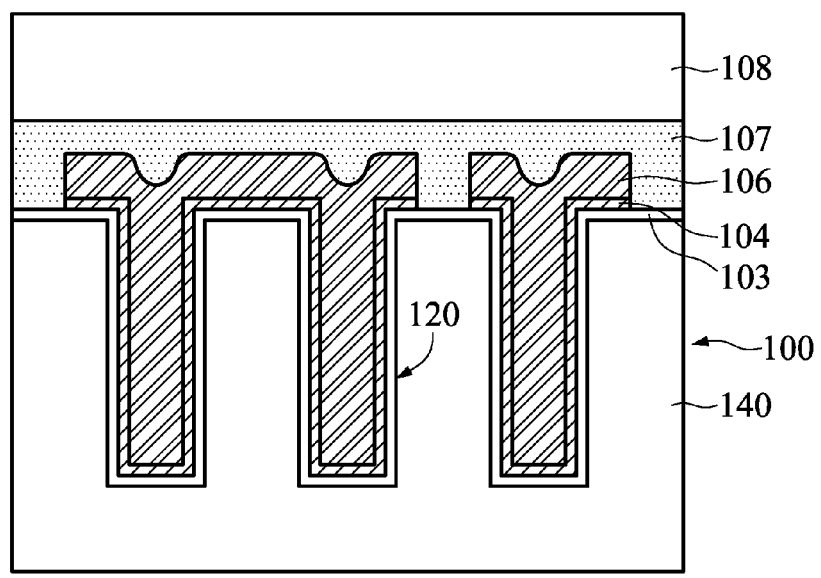

After copper plating and resist removal, the barrier/Cu-seed layer 104 in the areas that do not receive copper plating is removed, as shown in FIG. 6 in accordance with some embodiments. Processes used to remove barrier layer made with materials, such as TaN, Ta, Ti, TiN, CoW or a combination of above mentioned films, are known in the industry. Process(es) used to remove the dielectric isolation layer 103 is also known in the industry. Following the previous operation, the front of the substrate is glued to a second substrate 108. The second substrate 108 is a dummy substrate and can be made of a dielectric material, such as glass. Alternatively, the second substrate 108 can be made of a conductive material, such as metal. FIG. 7 shows that substrate 100 is glued to the second substrate 108 with a glue layer 107, in accordance with some embodiments. The material used for the glue layer 107 should allow easy removal when the dummy substrate 108 is no longer needed. In some embodiments, the material for the glue layer 107 is an epoxy polymer. The glue layer 107 is first applied on the first substrate 100 in liquid form. After the second substrate 108 is place over the glue layer 107, the glue layer can be left to dry or be heated at a low temperature. After drying and heating (or curing), substrate 100 is firmly attached to dummy substrate 108.

Figure 8:
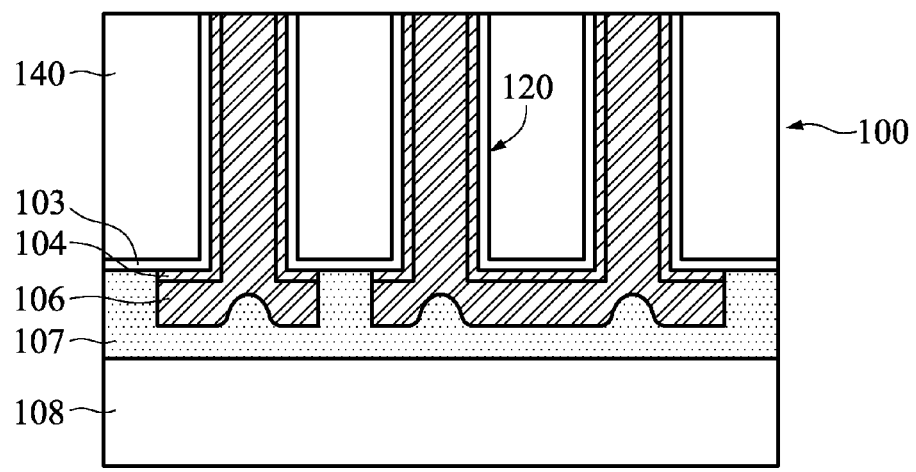

Afterwards, first substrate 100 undergoes backside grinding to remove excess silicon to expose the through silicon vias 120. In some embodiments, backside grinding is followed by a CMP processing to smooth the substrate surface that has undergone grinding. FIG. 8 shows the first substrate 100 after the backside silicon has been removed to expose the through silicon vias 120, in accordance with some embodiments. In some embodiments, the silicon removal process is a grinding process. Grinding wheel is commonly used in packaging process to remove excess silicon from silicon substrate. The grinding is performed until the isolation layer 103 and barrier/Cu-seed layer 104 are completely removed from the bottoms of through silicon vias 120.

Reducing the thickness of silicon substrate can improve heat dissipation efficiency of silicon substrate. Table II compares the simulation results for the thermal resistance of silicon substrates with varying thicknesses.

TABLE II

Comparison of thermal resistance for silicon substrates with varying thicknesses.

| Thickness (µm) | Thermal Resistance (K/Watt) |
|---|---|
| 500 | 4.82 |
| 200 | 3.18 |
| 100 | 1.81 |
| 50 | 0.92 |

The data show that the thermal resistance is greatly reduced when the substrate thickness is reduced to 100 µm. The thinner silicon thickness provide extra heat dissipation in addition to the heat dissipation provided by the copper in the through silicon vias (or trenches).

Figure 9:
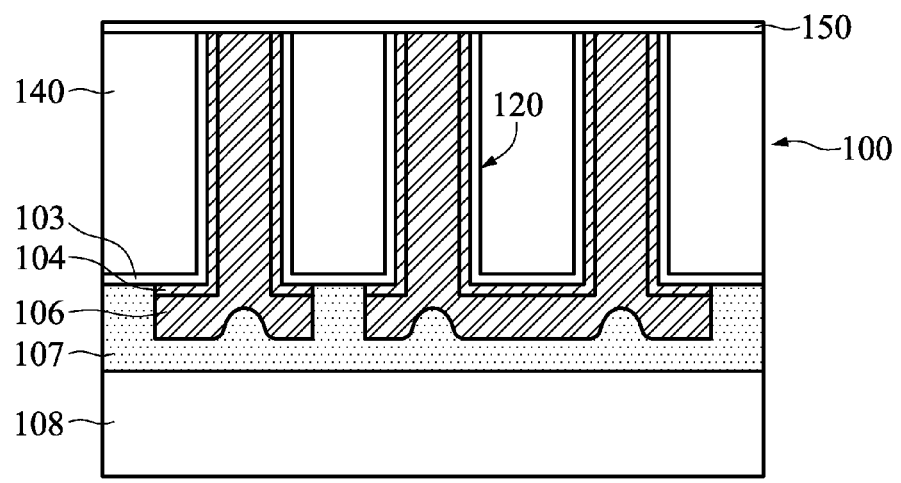

After backside grinding, the backside of first substrate 100 is deposited with a dielectric layer 150, as shown in FIG. 9 in accordance with some embodiments. Similar to isolation layer 103, dielectric layer 150 can be made of oxide, nitride, or a combination of both. One example of a material for the dielectric layer 150 is silicon oxide deposited by plasma enhanced chemical vapor deposition (PECVD) using silane as the silicon source. In some embodiments, the isolation layer has a thickness between about 5000 Å to about 20000 Å.

In some embodiments, the dielectric layer 150 can also be a doped film, using dopants such as phosphorus (P) or boron (B) and phosphorus (P). As mentioned above, the phosphorus (P) in the PSG or BPSG film can getter copper.

Figure 10:
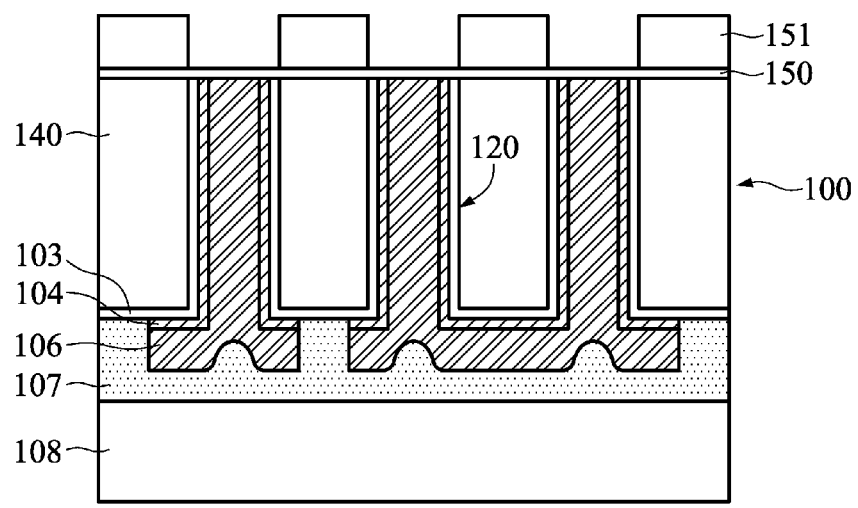
Figure 11:
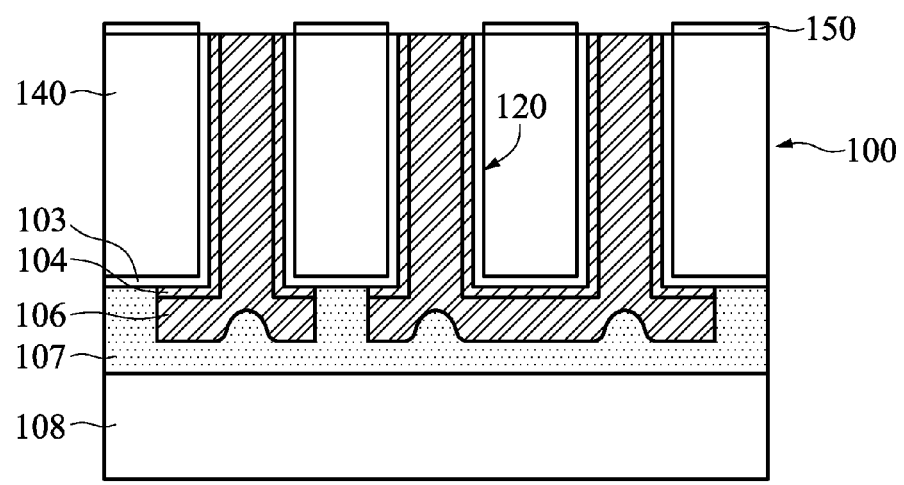

Following the deposition of dielectric layer 150, the substrate is deposited and patterned with a photoresist layer 151, as shown in FIG. 10 in accordance with some embodiments. The photoresist layer 151 can be deposited with a spin-on resist (wet) or a dry film resist. The pattern opens areas of through contact vias (or trenches) in order to remove the dielectric layer 150 of those areas. Afterward the photoresist pattern is formed, the dielectric layer 150 exposed by the pattern is removed by etching. Dielectric etching processes used in semiconductor chip manufacturing can be used to achieve the removal purpose. The etching processes can be dry processes or wet processes. FIG. 11 shows the first substrate 100 and the second substrate 108 after the dielectric layer 150 in the open areas is etched, in accordance with some embodiments.

Figure 12:
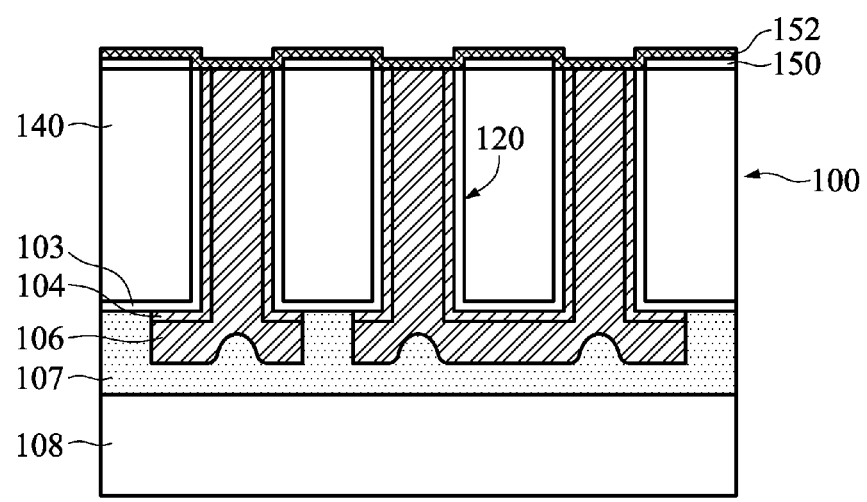

Afterwards, a barrier/Cu-seed layer 152 is deposited as shown in FIG. 12, in accordance with some embodiments. The barrier/Cu-seed is a composite layer of a barrier layer and a copper seed layer. The barrier layer protects the Si substrate from diffused copper. As mentioned above, Ta, TaN, Ti, TiN, CoW, or a combination of the above-mentioned films can be used as barrier. In some embodiments, the barrier material is Ti and a thickness between about 500 Å to about 5000 Å is deposited. A thin copper seed layer is deposited with a thickness between about 1000 Å to about 10000 Å. The deposition methods that can be used to deposit the barrier layer and copper seed layer have been mentioned above.

Figure 13:
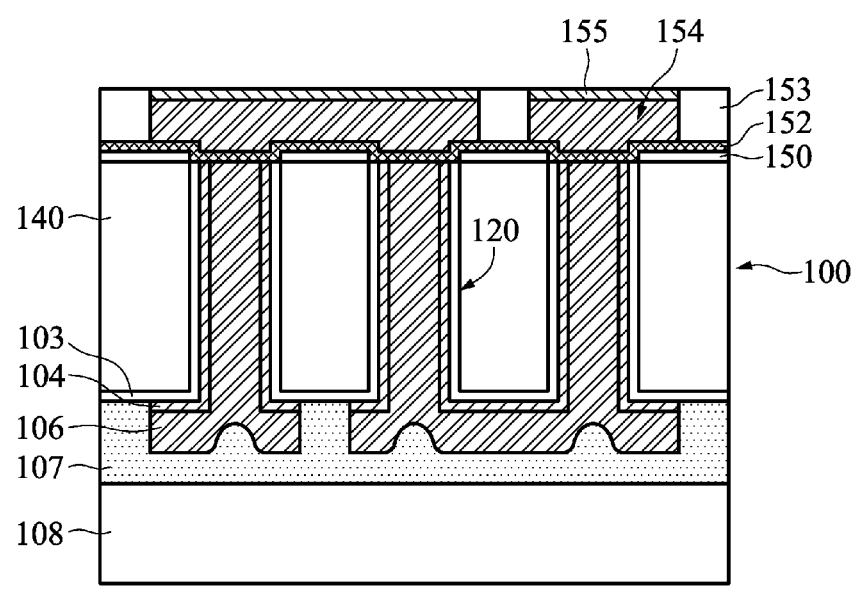

After the deposition of the barrier/Cu-seed layer 152, the substrate is patterned with a photoresist layer 153 to define regions receiving copper plating, as shown in FIG. 13 in accordance with some embodiments. As mentioned above, the photoresist can be a spin-on resist (wet) or a DFR. After resist patterning, a copper layer 154 is first plated on the exposed areas (not covered by the photoresist) of the substrate. As mentioned above, the plating process for copper layer 154 can be an electrical chemical plating process (ECP) or an electroless copper plating process. In some embodiments, the thickness of the copper layer 154 is less than 30 μm due to concern of substrate warping described above. In some embodiments, the thickness of copper layer 154 is between about 10 μm to about 20 μm. Afterwards, a diffusion barrier layer 155 is deposited cover layer 154. The diffusion barrier layer 155 will eventually receive a solder layer and an integrated circuit (IC) chip(s) (to be described below). The diffusion barrier layer 155 prevents copper from layer 154 from diffusing into the IC chips disposed above the TSV substrate. In some embodiments, the diffusion barrier layer 155 is also deposited by plating, such as ECP or electroless plating. In some embodiments, the diffusion barrier layer 154 is made of nickel immersion gold (ENIG). However, any appropriate diffusion barrier material may be used.

Figure 14:
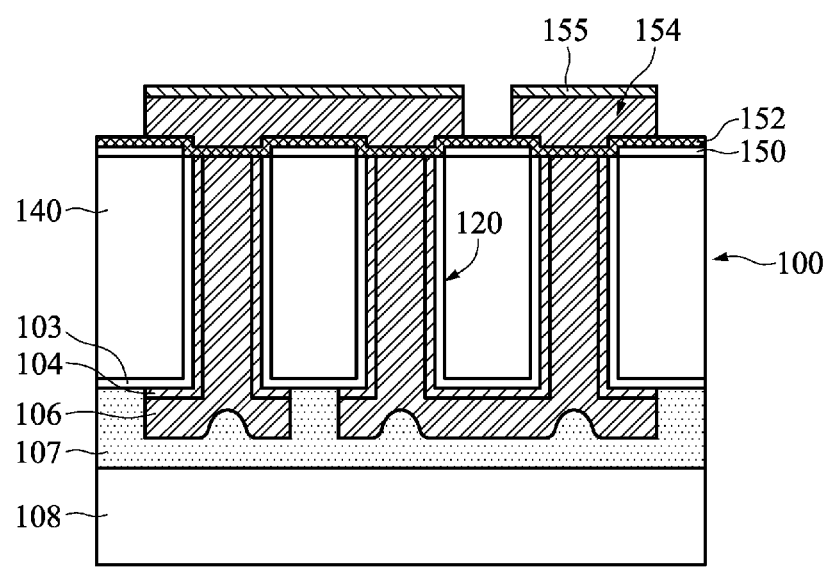

After the deposition of the diffusion barrier layer 155, the photoresist layer 153 and the barrier/Cu-seed layer 152 underneath the photoresist layer 153 are removed. FIG. 14 shows substrate 100 without the photoresist layer 153 and the barrier/Cu-seed layer 152 underneath, in accordance with some embodiments. At this point, the first substrate 100 is prepared to receive the semiconductor chip. Different semiconductor chips could be mounted on the first substrate 100 with slightly different process flows. In some embodiments, the semiconductor chips are light emitting devices (LEDs).

Figure 15:
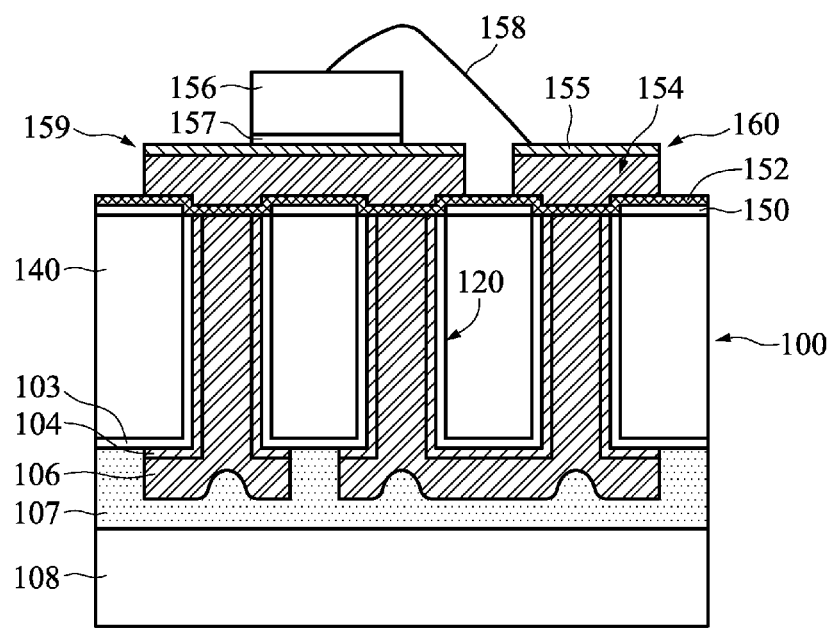

Following the previous operation, a semiconductor chip 156 is secured to the diffusion barrier layer 155 with the help of a eutectic bonding layer 157. In some embodiments, the eutectic bonding layer 157 is made of solder. In the embodiment shown in FIG. 15, the semiconductor chip 156 is a light-emitting device (LED). The LED chip is placed on P-contact 159, and the LED chip is electrically connected to N-contact 160 via a wire 158. A wire bonding operation is performed to connect the LED chip 156 to the N-contact 160. FIG. 15 shows the LED chip 156 being placed on the first substrate 100 and bonded to the substrate 100 by the eutectic bonding layer 157 and also being bonded to the N-contact via a wire 158, in accordance with some embodiments. The LED chip 156 is directly placed on the first substrate 100 without a conductive bump because the surface of layer 155 of P-contact 159 is relatively planar.

The copper layer 154 of FIGS. 13-15 provides electrical connection and thermal contact to the semiconductor chip (such as an LED chip) 156 placed on top. The copper layer 154 can also be referred to as a metal pad and does not need to be made of copper. In some embodiments, the metal pad (154) can be made of solder, which can be deposited by a plating process (as described above) or by applying a solder paste over the substrate surface after the photoresist layer 153 is patterned. The solder paste would fill in the openings created by the photoresist layer 153 and leaves very little amount over the photoresist layer 153. The small amount of solder paste over the photoresist layer 153 would have little effect on the removal process of the photoresist layer 153. If solder is used for layer 154 (as a metal pad), the copper seed layer portion of barrier/Cu-seed layer 152 is not needed, in accordance with some embodiments. If the solder layer is plated, a solder seed layer or a seed layer made of non-solder material can be used. However, if the solder layer is pasted on the substrate, a seed layer is not needed.

As shown in FIG. 15, portions of TSVs 120 and layer (or metal pad) 154 extend beyond the edges of the LED chip 156. The extension of electrical and/or thermal connections (such as TSVS 120 and layer 154) of a package substrate (such as substrate 100) beyond the boundary of the semiconductor chip (such as LED 156) can be called fan-out packaging, which provide extra additional area for rerouting and for heat dissipation. The extension of metal layer 154 beyond the edges of LED chip 156 provides horizontal pathways and areas for heat dissipation. The extension of TSVs 120 beyond the edges of LED chip 156 provides rooms for additional TSVs 120 to provide vertical paths and areas for heat dissipation. Both the horizontal and vertical pathways and areas affect and improve the efficiency of heat dissipation.

Figure 16:
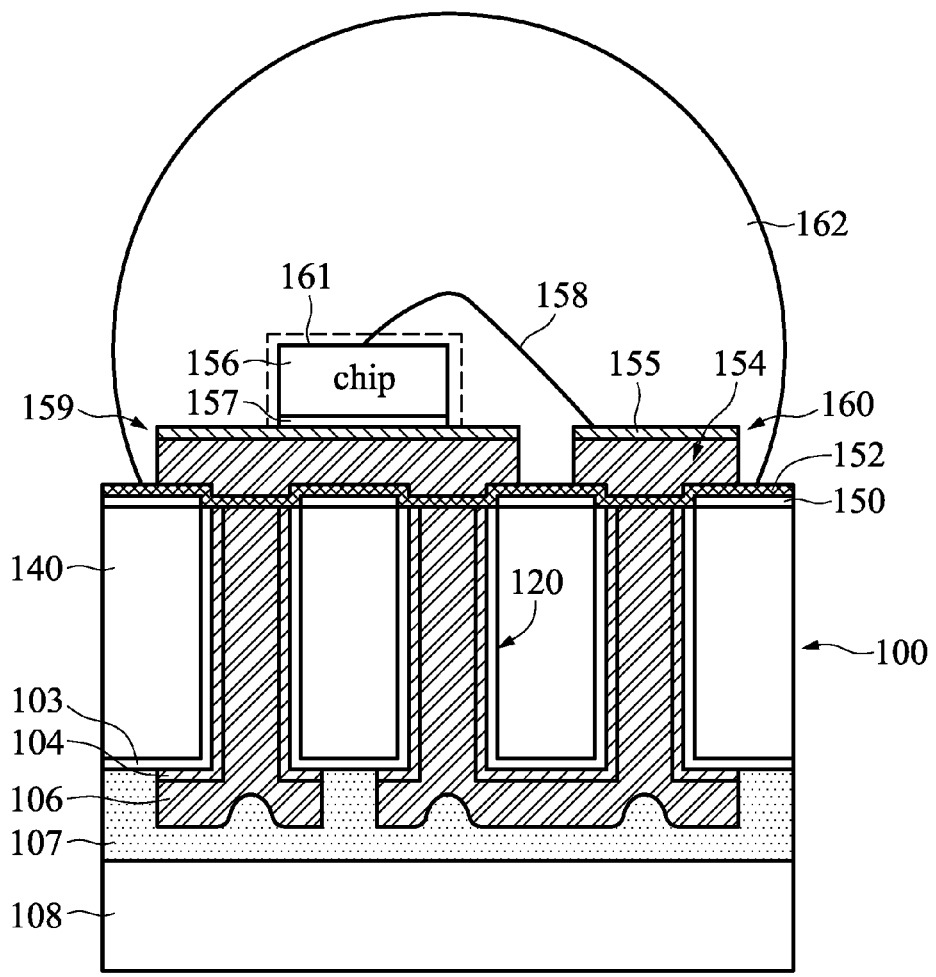

After the LED chip 156 is bonded to the substrate and wire bonded, the LED chip 156 is packaged, as shown in FIG. 16 in accordance with some embodiments. In some embodiments, a layer of phosphorus film 161 is deposited on the LED chip 156. An LED chip is designed to emit red, blue, or green light. LED chips emitting red, blue and green light are often placed together in order to create white light. Phosphorous film can also be used to generate white light. In some embodiments, the phosphorus film 161 is coated on the LED chip 156. However, coating of the phosphorous film 161 is optional. In some embodiments, different phosphorus films are coated on LEDs with different colors (or different emitted wavelengths). In some other embodiments, a phosphorous film, such as film 161, is not needed.

Afterwards, a molding material 162 is deposed to surround the LED chip 156, the P-contact 159, and the N-contact 160. In some embodiments, the molding is made of a transparent epoxy resin. The molding material being transparent is relevant to LEDs. If the semiconductor chip is not an LED, the molding does not need to be transparent.

Figure 17:
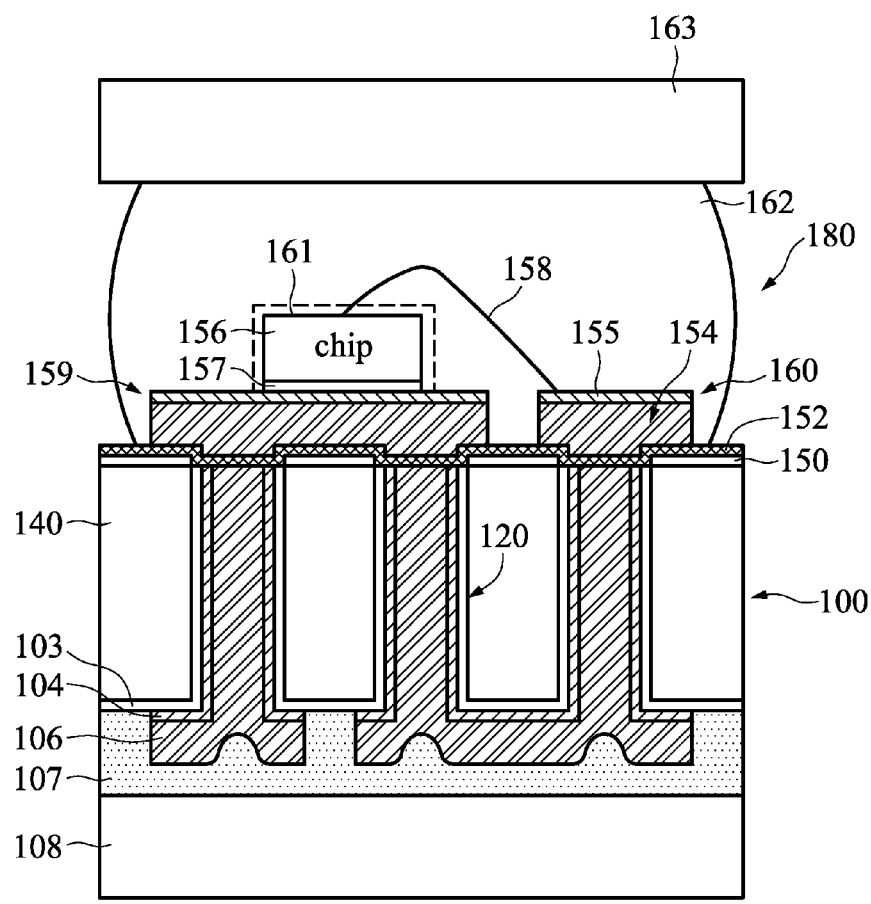
Figure 18:
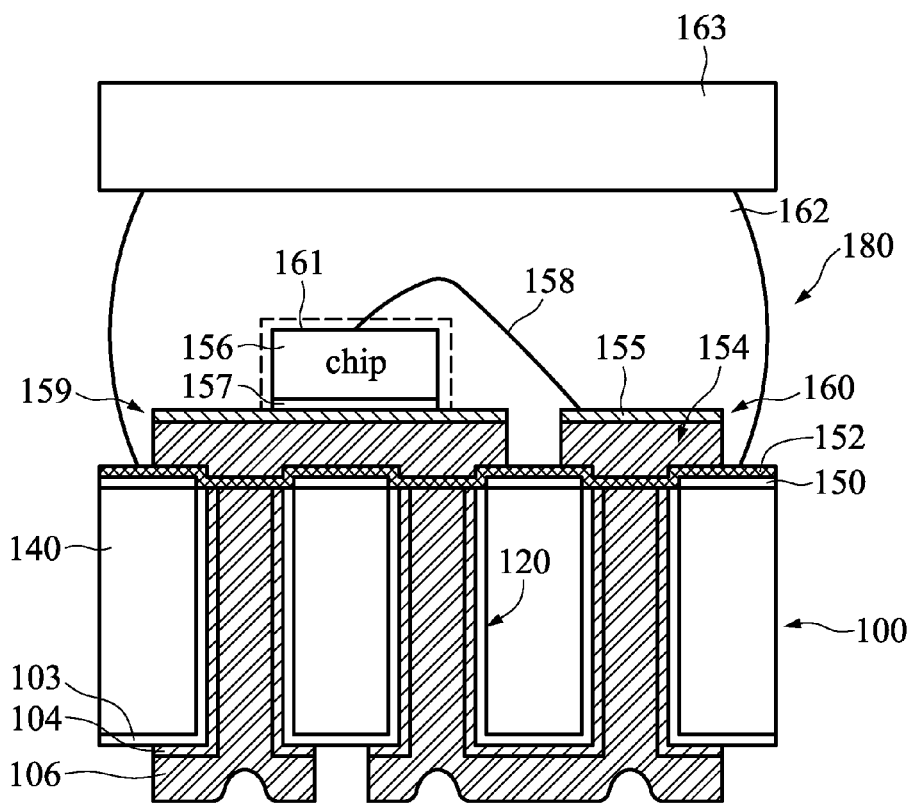

FIG. 17 shows the side of molded LED chip 156 is placed on an adhesive tape 163, in accordance with some embodiments. The adhesive tape (sometimes called blue tape) 163 securely supports the molding 162 of the LED chip 156 and the first substrate 100 in preparation of detaching (or debonding) the second substrate 108. After the second substrate 108 and the glue layer 107 are chemically and mechanically removed, the first substrate 100 is sawed to physically separate dies on the first substrate 100, with each die having an LED chip 156, N-contact and P-contact. FIG. 18 shows the dummy substrate 108 and glue layer 107 having been removed and the adhesive tape 164 holding a single packaged chip 180, in accordance with some embodiments. Other processing operations, such as placing packaged chip 180 on a PCB, removing adhesive tape layer 163 etc., may follow afterwards.

The exemplary process flow described above shows how semiconductor chips could be packaged with a substrate with through silicon vias to improve heat dissipation. Further, the heat dissipation of the packaged chip described above is superior to other through silicon via technologies because the thickness of the silicon substrate has been thinned to between about 20 μM to about 200 μm.

As mentioned above, the chip packaging method and structures described above can be used for semiconductor chips that are not LEDs. When the packaging methods and structures are used for non-LED chips, the process flows after FIG. 15 could be different.

Figure 19A:
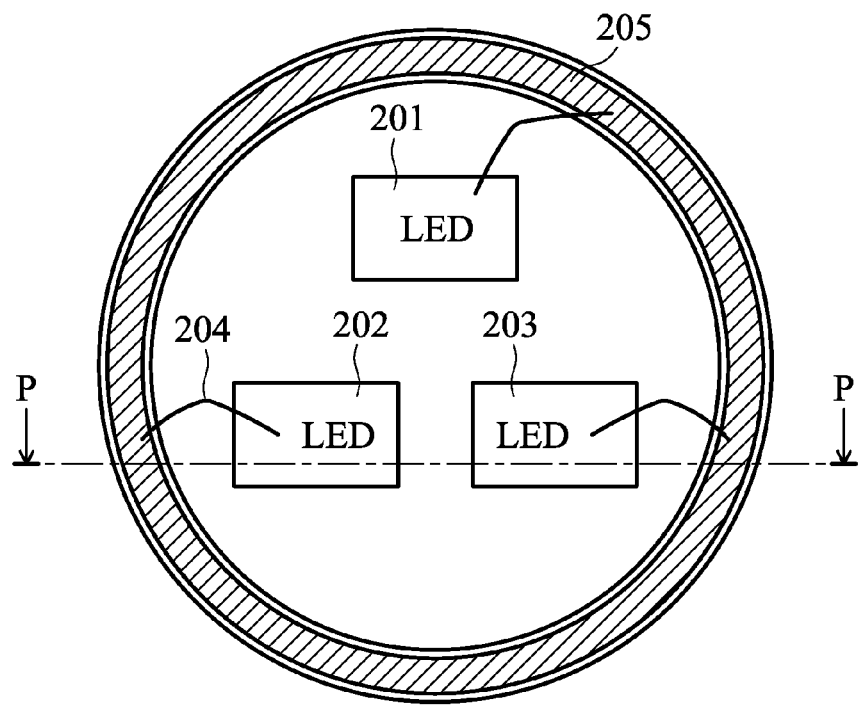
FIG. 19A shows a top view three LED chips being encircled by a single P-contact 205, in accordance with some embodiments.
Figure 19B:
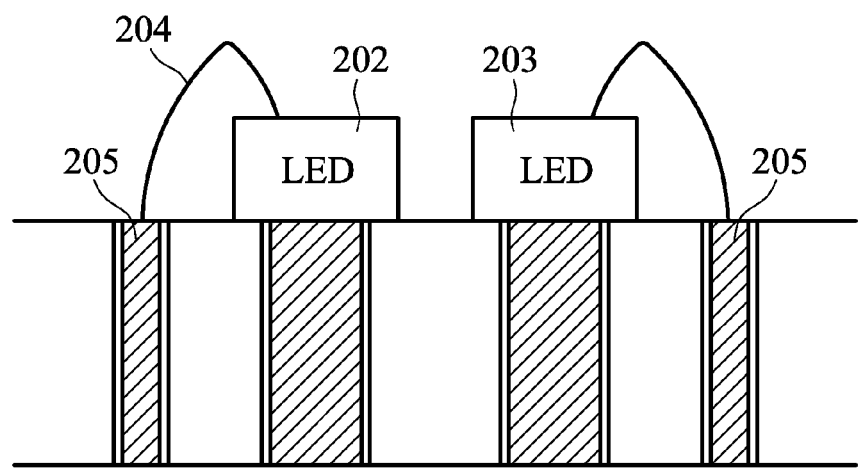
FIG. 19B shows a simplified cross sectional view of FIG. 19A, in accordance with some embodiments.

FIGS. 15-18 show the cross section of one single semiconductor device, which is an LED device. Alternatively, a package can hold more than one single device. Often 3, 6, or even higher number of LED chips are held in one package. FIG. 19A shows a top view 3 LED chips 201, 202, 203 being encircled by a single N-contact 205 and are connected to the N-contact (or electrode) 205 through wires, such as wire 204, in accordance with some embodiments. FIG. 19B shows a simplified cross sectional view of FIG. 19A cut along line PP, in accordance with some embodiments. Not all layers involved in the package are shown. In some embodiments, the three LEDs, 201, 202, 203, are designed to emit different wavelengths of light, such as blue, green, and red. Under each LED chip, there is at least one through silicon via. For instance, in the example shown above in FIGS. 1-19, there are two through silicon vias under each LED chip. In the embodiment shown in here, the N-contact (or N-electrode) 205 is a circular through silicon trench (or via).

Figure 20A:
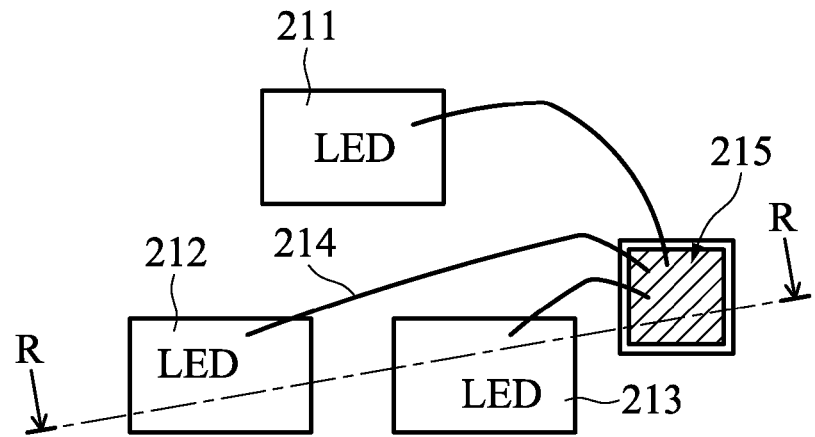
FIG. 20A shows a schematic view of three LED chips coupled to a single P-electrode, in accordance with some embodiments.
Figure 20B:
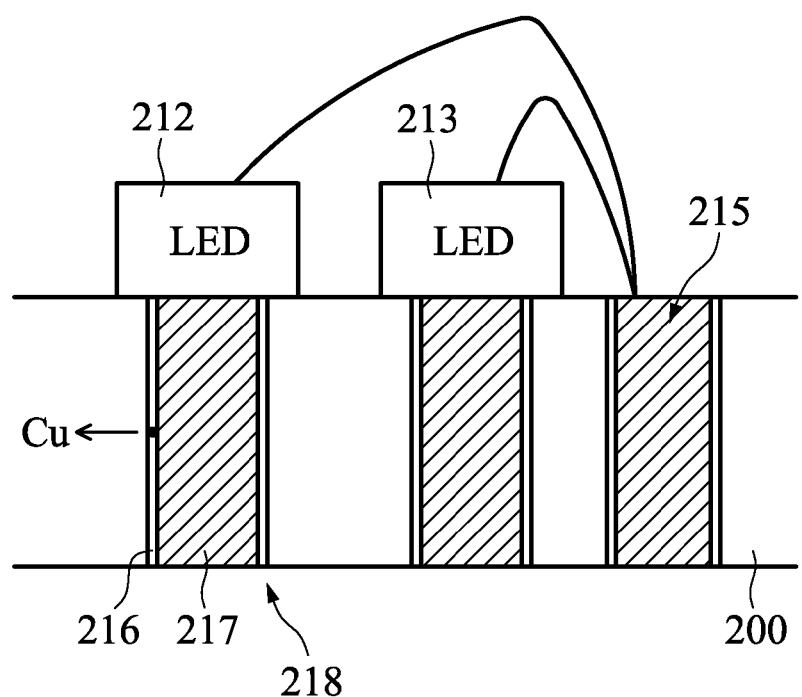
FIG. 20B shows a cross section view of FIG. 20A, in accordance some embodiments.
Figure 20C:
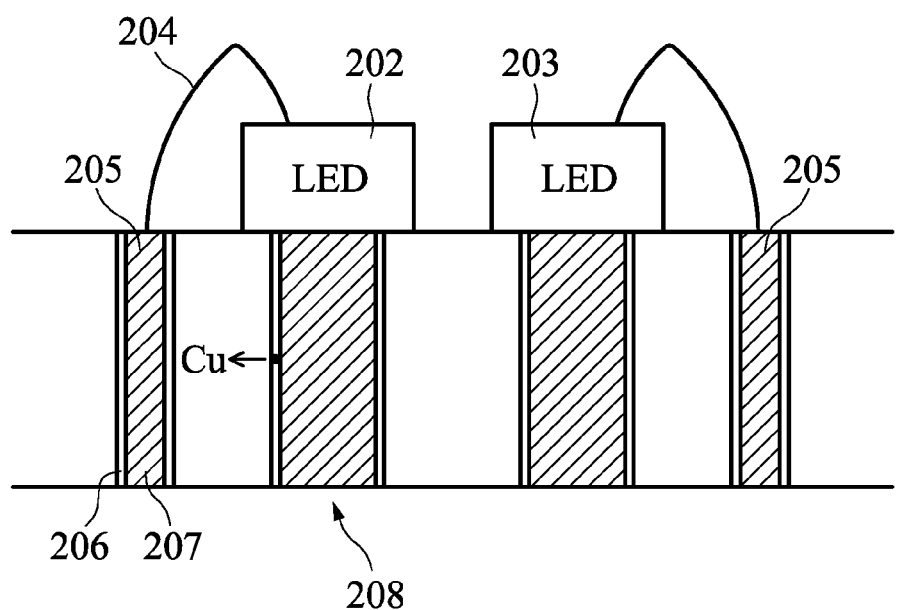
FIG. 20C shows a cross sectional diagram of FIG. 19B, in accordance some embodiments.

FIG. 20A shows a schematic view of 3 LED chips 211, 212, 213 coupled to a single N-electrode 215, in accordance with another embodiment of this disclosure. FIG. 20B shows a cross section view of FIG. 20A cut along line RR, in accordance with some embodiments of this disclosure. If there is insufficient sidewall coverage of copper barrier layer 216 for the through silicon via 218 for LED chip 212, the copper 217 in via 212 could diffuse to neighboring structures (not shown) and cause leakage problem. FIG. 20C shows another embodiment of the cross sectional diagram of FIG. 19B. When copper of via 208 diffuse outward due to poor step coverage of copper barrier layer, the diffused copper would be stopped by the copper barrier layer 206 of P-electrode 205. Therefore, having through silicon trench surrounding through silicon vias (or trenches) under devices provide extra protection against copper diffusion.

Figure 21:
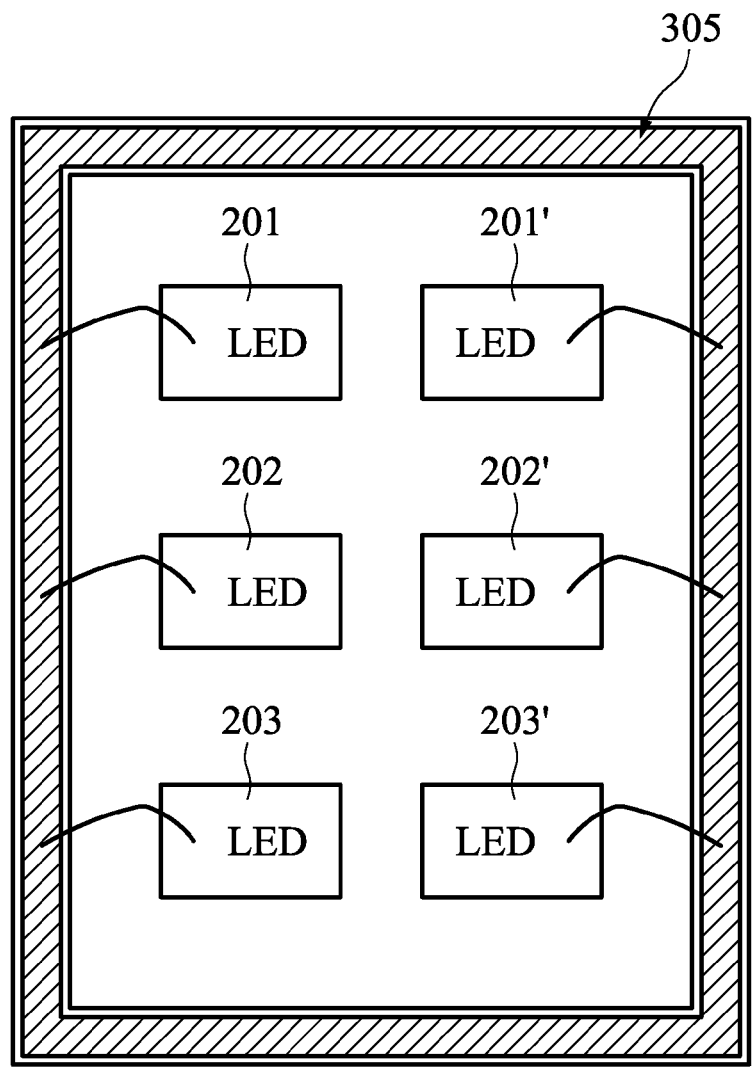
FIG. 21 shows LED chips being packaged by the through silicon via technology, in accordance with some embodiments.

FIG. 21 shows another embodiment of LED chips being packaged by the through silicon via technology described above. 6 LED chips, 201, 201', 202, 202', 203, 203' are placed in one package and are surrounded by a rectangular-shaped N-contact (or N-electrode) via wires. The 6 LED chips can be made of 2 blue LEDs, 2 green LEDs and 2 red LEDs.

Figure 22A:
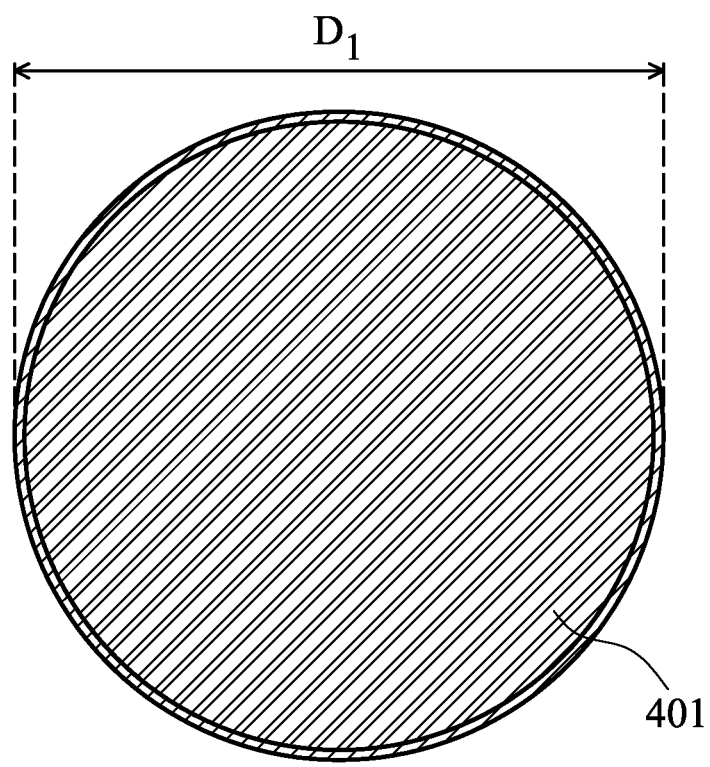
FIGS. 22 (A)-(G) show various embodiments of through silicon plugs (TSPs).

Through silicon plugs (or vias, or trenches) under the semiconductor chips could be in various shapes and dimensions. For example, the through silicon vias can be in the shape of cylinders. FIG. 22(A) shows a top view of a TSP (or TSV) 410 (a cylinder) under a semiconductor chip, in accordance with some embodiments. As mentioned above, the diameter of the TSP 401 is D1. As mentioned above, D1 may be in the range between about 5 μm to about 100 μm. For small chips with about the same surface areas (or top surface areas) as the surface of TSP 401, a single TSP, such as TSP 401, can be used. However, often the semiconductor chips have surface area (or top surface area) much larger than the surface area of a single TSP. For example, the surface area of an LED chip can be 0.6×0.6 mm$^2$, 1×1 mm$^2$, or larger. Note that these numbers are merely examples. In addition, the top surface of the semiconductor chip does not have to be in square shape. The top surface can be in rectangular shape or in other shapes.

Figure 22B:
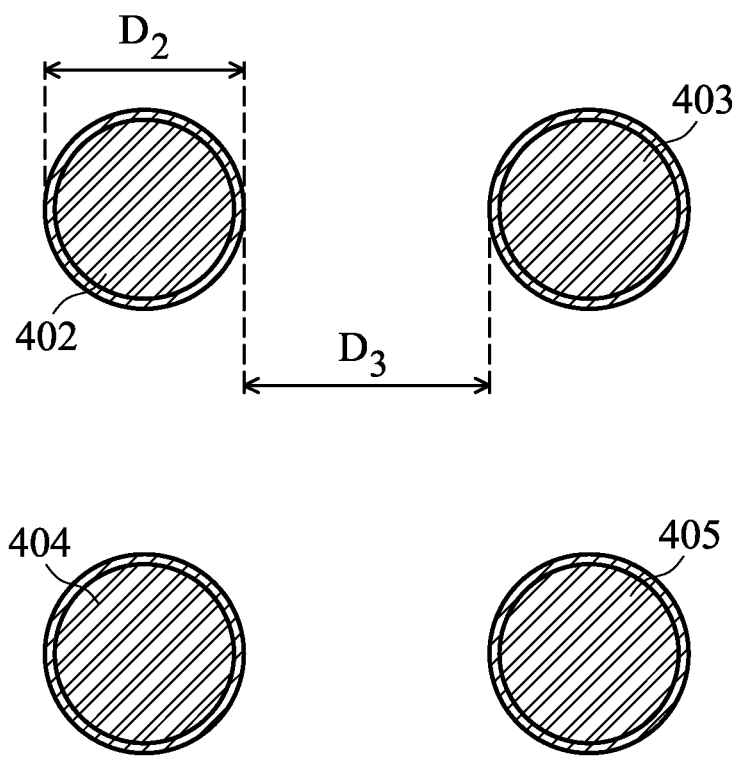

A TSP cannot be made to large (or with a cross section that is too large) to avoid extensive gap-filling time and other issues. FIG. 22(b) shows an embodiment of TSPs with multiple TSPs, such as 402, 403, 404, and 405, to provide sufficient thermal dissipation capability for the semiconductor chip disposed over the TSPs. FIG. 22(B) only shows 4 TSPs. However, there could be more than 4 TSPs or less than 4 TSPs (such as 2 or 3). In some embodiments, the diameter D2 for each TSP in FIG. 22(b) is between about 5 μm to about 100 μm. D3 is the smallest distance between two TSPs in FIG. 22(B). In some embodiments, D3 is equal to or larger than D2.

Figure 22C:
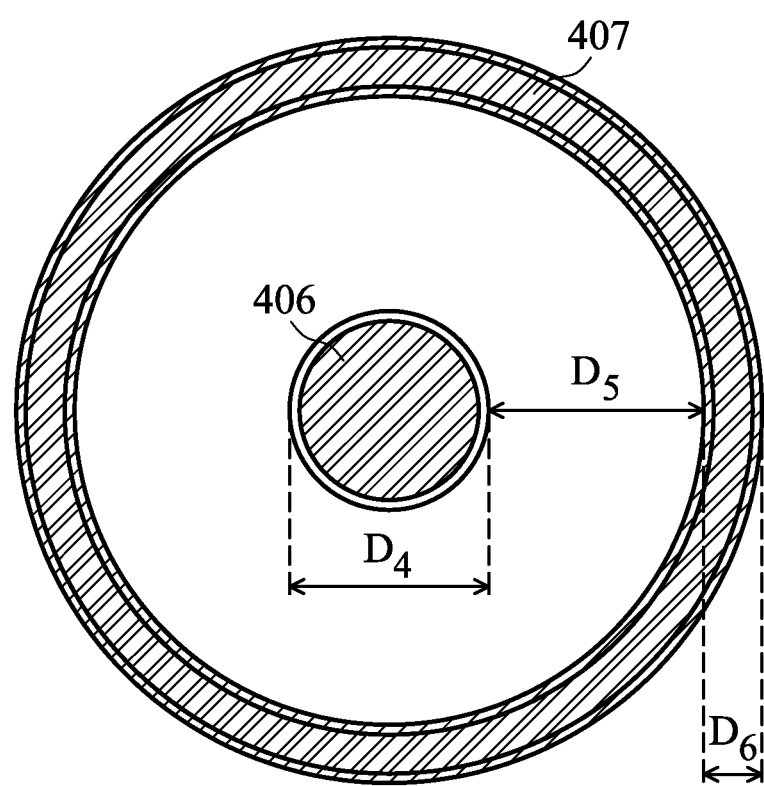

In some embodiments, the TSPs (or TSVs) can be in the shape of concentric rings, as shown in FIG. 22(C). There could be one or more concentric rings. FIG. 22(C) shows one concentric ring 407, surrounding a central cylinder 406. In some embodiments, the diameter D4 for TSV 406 is between about 5 μm to about 100 μm. In some embodiments, the width D6 for TSP (or through silicon trench) 407 in FIG. 22(B) is between about 5 μm to about 100 μm. In some embodiments, the distance between the TSPs, D5, is equal to or larger than either D4 or D6.

Figure 22D:
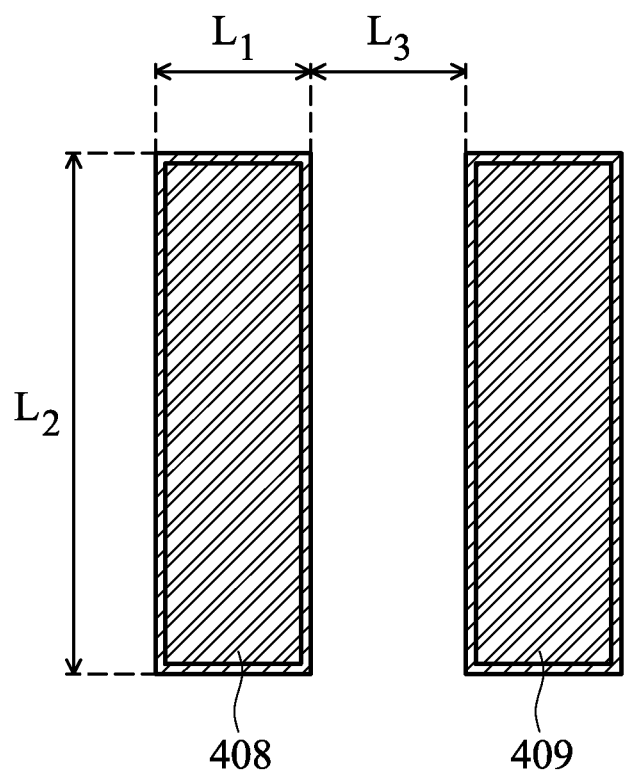

TSPs do not need to be in circular shapes. FIG. 22(D) shows a number of TSPs, such as TSPs 408 and 409, in accordance with some embodiments. The TSPs (or through silicon trenches) 408 and 409 are in rectangular shapes with a width L1 and with a length L2, and are separated by a distance L3. In some embodiments, the width L1 is between about 5 μm to about 100 μm. In some embodiments, the distance between the TSPs, L3, is equal to or larger than L1. The number of rectangular-shaped TSPs could be one or more.

Figure 22E:
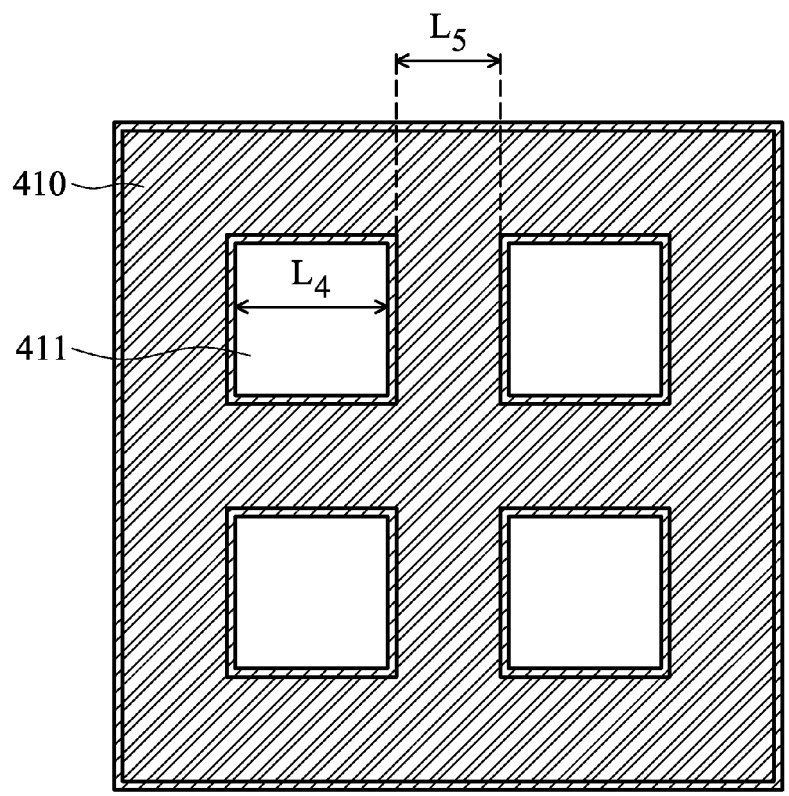
Figure 22F:
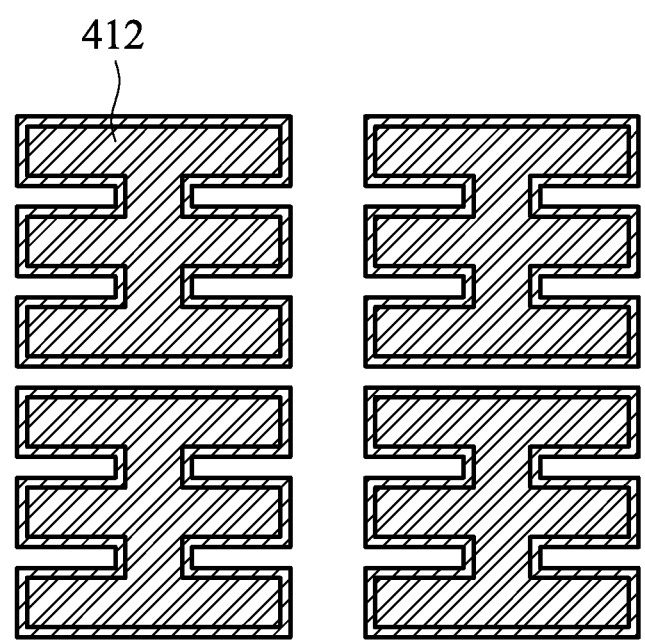
Figure 22G:
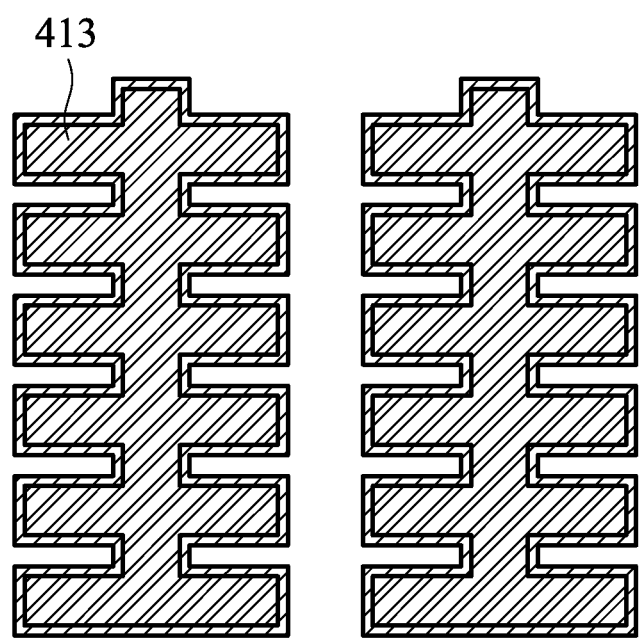

In some embodiments, the TSPs could be a pattern, as shown in FIG. 22(E). FIG. 22(E) shows that a patterned TSP 410 having a number of openings, such as opening 411, in the pattern. The openings 411 in FIG. 22(E) are square-shaped. However, the openings can be rectangular columns or circular cylinders. In some embodiments, the distance between the openings 411 is L5, which is equal to or smaller than the width of the opening L4. FIGS. 22(F) and 22(G) show two different versions of TSPs, in accordance with some embodiments. The TSPs 412 of FIG. 22(F) and TSPs 413 of FIG. 22(G) have patterns that allow large surface area of TSPs. Yet the TSPs of FIGS. 22(F) and 22(G) are not one large continuous piece. Such patterns prevents manufacturing issues, such as long plating time and others. Other shapes, patterns and arrangements of TSVs or TSPs that are not mentioned here, or are variation of the structures mentioned above are also possible. In some embodiments, the corners of the patterns shown in FIGS. 22 (D), (E), (F), and (G) are rounded.

The embodiments of through silicon plugs with different patterns described above can be used under one or more semiconductor chip(s) to improve heat dissipation and to resolve manufacturing concerns, such as long copper plating time.

The embodiments described above provide methods and structures for packaging semiconductor devices with through silicon vias (or trenches). The substrate with through silicon vias enables excellent heat dissipation by through silicon plugs (or vias) for semiconductor chips without the problems of thermal stress, poor heat dissipation, poor reliability, poor product lifetime, electrical insulation, and high cost associated with conventional packaging structures.

The substrate with through silicon plugs (or vias) described above removes the need for conductive bumps. The process flow is very simple and cost efficient. The structures described herein combines the separate TSV, redistribution layer, and conductive bump structures into a single structure. By combining the separate structures, a low resistance electrical connection with high heat dissipation capability is created. In addition, the substrate with through silicon plugs (or vias, or trenches) also allows multiple chips to be packaged together. A through silicon trench can surround the one or more chips to provide protection against copper diffusing to neighboring devices during manufacturing. In addition, multiple chips with similar or different functions can be integrated on the TSV substrate. Through silicon plugs with different patterns can be used under a semiconductor chip(s) to improve heat dissipation and to resolve manufacturing concerns.

In one embodiment, a semiconductor device package is provided. The package includes a substrate with through silicon plugs extending from a first surface of the substrate to a second surface opposite to the first surface. Sidewalls of the one or more through silicon plugs are lined with an isolation layer and a first copper barrier layer. The through silicon plugs are filled with a first copper layer, and the through silicon plugs have first ends and second ends. The second ends have the first copper layer extended above the first surface of the substrate and the first ends have the first copper layer flushed with the second surface of the substrate. The package also includes a second copper layer formed on the first ends of the through silicon plugs. The second copper layer defines an area to receive a semiconductor chip, and there is a second copper barrier layer separates the first copper layer on the first ends of the through silicon plugs and the second copper layer. The package further includes the semiconductor chip disposed on the area defined by the second copper layer.

In another embodiment, a semiconductor device package is provided. The package includes at least three light-emitting devices (LEDs). The at least three LEDs emit light with more than one wavelengths. The package also includes a substrate with one or more through silicon plugs extending from a first surface of the substrate to a second surface opposite to the first surface. Sidewalls of the one or more through silicon plugs are lined with an isolation layer and a first copper barrier layer, and the one or more through silicon plugs are filled with a first copper layer. The one or more through silicon plugs have first ends and second ends, and wherein the second ends have the first copper layer extended above the first surface of the substrate and the first ends have the first copper layer flushed with the second surface of the substrate. The package further includes a second copper layer formed on the first ends of through silicon plugs. The second copper layer defines an area to receive the at least three LEDs, and there is a second copper barrier layer separates the first copper layer on the first ends of the one or more through silicon plugs and the second copper layers. The at least three LEDs are disposed on the area defined by the second copper layer. One of the through silicon plugs is shaped as a trench surrounding the at least three LEDs and the through silicon plugs disposed under the at least three LEDs. The first barrier layer in the trench protects against copper diffusion from through silicon plugs encircled by the trench.

In yet another embodiment, a method of creating a semiconductor package utilizing through silicon plugs is provided. The method includes an operation of providing a first substrate, and an operation of forming through silicon plugs in the first substrate extending from a first surface of the first substrate. The through silicon plugs are lined with an isolation layer and a first copper barrier layer, and the through silicon plugs are filled with a first copper layer. The method also includes an operation of removing excess silicon from the first substrate to expose first ends of through silicon plugs buried in the first substrate. The method further includes an operation of forming a second copper layer on the first ends of through silicon plugs. A second copper barrier layer is deposited on the first ends of through silicon plugs before forming the second copper layer. In addition, the method includes an operation of placing the semiconductor chip a surface on the first ends of on the second copper layer.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A semiconductor device package, comprising:
   a substrate with through silicon plugs extending from a first surface of the substrate to a second surface opposite to the first surface, wherein the substrate is a silicon substrate or a silicon-on-insulator (SOI) substrate, and wherein sidewalls of the one or more through silicon plugs are lined with an isolation layer and a first copper barrier layer, and wherein the through silicon plugs are filled with a first copper layer, wherein the through silicon plugs have first ends and second ends;
   a first conductive contact pad formed over one or more of the first ends of a first subset of the through silicon plugs, wherein the first subset of the through silicon plugs include a plurality of through silicon plugs;
   a second conductive contact pad formed over one or more of the first ends of a second subset of the through silicon plugs, wherein the second conductive contact pad is separated from the first conductive contact pad by a gap;
   a semiconductor chip disposed on the first conductive contact pad, wherein the semiconductor chip is coupled to the second conductive contact pad by a bond wire, and wherein a substantial entirety of a surface of the semiconductor chip is in contact with the first conductive contact pad; and
   a molding material disposed over the first conductive contact pad, the second conductive contact pad, and the semiconductor chip, wherein the molding material is free of being laterally confined, and wherein both sidewall surfaces of the first and second conductive contact pads are covered by the molding material.

2. The package of claim 1, wherein a height of the through silicon plugs is between about 20μm to about 200μm, and wherein a width of the through silicon vias is between about 10μm to about 100μm, and wherein the first conductive contact pad has a greater lateral dimension than the semiconductor chip.

3. The package of claim 1, wherein the substrate contains electrical circuitry therein, the electrical circuitry including at least one of: transistors, capacitors, resistors, diodes, and fuses.

4. The package of claim 1, further comprising a second copper barrier layer separating the first copper layer on the first ends of the through silicon plugs and the first and second conductive contact pads, and wherein the first and second copper barrier layers are made of one or more materials selected from a group consisting of Ti, TiN, Ta, TaN, CoW, and a combination of the above mentioned films.

5. The package of claim 1, wherein the first and second conductive contact pads each comprises a second copper layer, a eutectic bonding layer and a copper diffusion barrier layer, and wherein the copper diffusion barrier layer is in direct contact with the second copper layer, and wherein the eutectic bonding layer is in direct contact with the semiconductor chip.

6. The package of claim 1, wherein the semiconductor chip is a light-emitting device (LED).

7. The package of claim 1, wherein one of the through silicon plugs is shaped as a trench surrounding the semiconductor chip and through silicon plugs disposed under the semiconductor chip, and wherein the first barrier layer in the trench protects against copper diffusion from through silicon plugs encircled by the trench.

8. The package of claim 1, wherein one of the through silicon plugs is shaped as a circular trench or a rectangular trench with rounded corners.

9. The package of claim 1, wherein there is one or more of the through silicon plugs under the semiconductor device, and wherein the one or more through silicon plugs have a cross section selected from a group consisting of a single circle, multiple circles, a single rectangle, multiple rectangles, a single pattern with at least 4corners, and multiple patterns with at least 4corners on one of the multiple patterns.

10. A semiconductor device package, comprising:
at least three light-emitting devices (LEDs), wherein the at least three LEDs emit light with more than one wavelengths;
a substrate with one or more through silicon plugs extending from a first surface of the substrate to a second surface opposite to the first surface, wherein sidewalls of the one or more through silicon plugs are lined with an isolation layer and a first copper barrier layer, and wherein the one or more through silicon plugs are filled with a first copper layer, wherein the one or more through silicon plugs have first ends and second ends, and wherein the second ends have the first copper layer extended above the first surface of the substrate and the first ends have the first copper layer flushed with the second surface of the substrate;
a second copper layer formed on the first ends of through silicon plugs, wherein the second copper layer defines an area to receive the at least three LEDs, wherein there is a second copper barrier layer separates the first copper layer on the first ends of the one or more through silicon plugs and the second copper layers, wherein the at least three LEDs are disposed on the area defined by the second copper layer; and wherein one of the through silicon plugs is shaped as a trench surrounding the at least three LEDs and the through silicon plugs disposed under the at least three LEDs, and wherein the first barrier layer in the trench protects against copper diffusion from through silicon plugs encircled by the trench.

11. The package of claim 10, wherein there are 6LEDs on the package.

12. The package of claim 10, wherein the one of the through silicon plugs is shaped as a circular trench or a rectangular trench with rounded corners.

13. The package of claim 10, wherein there is one or more of the through silicon plugs under the at least three LEDs, and wherein the one or more through silicon plugs have a cross section selected from a group consisting of a single circle, multiple circles, a single rectangle, multiple rectangles, a single pattern with at least 4corners, and multiple patterns with at least 4corners on one of the multiple patterns.

14. A semiconductor package comprising:
a first substrate having a plurality of through-silicon plugs having first ends buried in the first substrate and bodies extending from a first side toward a second side of the first substrate, wherein the through-silicon plugs are lined with an isolation layer and a first copper barrier layer, and wherein the through-silicon plugs are filled with a first copper layer, and wherein the first substrate contains electrical circuitry therein, the electrical circuitry including at least one of: transistors, capacitors, resistors, diodes, and fuses;
a plurality of areas of the first substrate devoid of silicon, the areas aligned with the first ends of the plurality of the through-silicon plugs buried in the first substrate, the areas including a second copper layer and a second copper barrier layer deposited on the first ends of through-silicon plugs, wherein the second copper layer includes a first conductive pad and a second conductive pad spaced apart from the first conductive pad;
a light-emitting diode (LED) chip directly bonded to the first conductive pad and wire bonded to the second conductive pad of the second copper layer, wherein the LED chip has a smaller lateral dimension than the second copper layer, and wherein a p-side of the LED chip is bonded to the first conductive pad, and wherein an n-side of the LED chip is wire bonded to the second conductive pad; and
a lens housing the semiconductor chip and the first conductive pad or the second conductive pad therein, wherein the lens is free of being circumferentially confined, and wherein the first and second conductive pads are disposed entirely within the lens housing.

15. The package of claim 14, further comprising:
a diffusion barrier layer deposited on the second copper layer after the second copper layer is formed;
a eutectic bonding layer deposited on the diffusion barrier layer.

16. The package of claim 14, wherein a height of the through silicon plugs is between about 20 microns to about 200 microns.

17. The package of claim 14, wherein the first and second copper barrier layers are made of one or more materials selected from a group consisting of Ti, TiN, Ta, TaN, CoW, and a combination of the above mentioned films.

18. The package of claim 14, wherein the first copper layer and the second copper layer are deposited by one or more copper plating processes, and wherein the second copper layer forms a thermal interface with a bottom area of the chip that consumes a substantial entirety of the bottom area.

19. The package of claim 14, wherein the lens has a curved cross-sectional profile.

20. The package of claim 14, wherein the first substrate is one of: a silicon substrate and a silicon-on-insulator (SOI) substrate.

\* \* \* \* \*